(12) United States Patent
Yagubizade et al.

(10) Patent No.: US 11,809,088 B2
(45) Date of Patent: Nov. 7, 2023

(54) METHOD FOR CONTROLLING A LITHOGRAPHIC APPARATUS

(71) Applicant: ASML NETHERLANDS B.V., Veldhoven (NL)

(72) Inventors: Hadi Yagubizade, Eindhoven (NL); Min-Seok Kim, Hwaseong (KR); Yingchao Cui, Eindhoven (NL); Daan Maurits Slotboom, Wolphaartsdijk (NL); Jeonghyun Park, Eindhoven (NL); Jeroen Cottaar, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/636,452

(22) PCT Filed: Jul. 22, 2020

(86) PCT No.: PCT/EP2020/070701
§ 371 (c)(1),
(2) Date: Feb. 18, 2022

(87) PCT Pub. No.: WO2021/032398
PCT Pub. Date: Feb. 25, 2021

(65) Prior Publication Data
US 2022/0334500 A1 Oct. 20, 2022

(30) Foreign Application Priority Data

Aug. 22, 2019 (EP) ..................................... 19193151
Jan. 13, 2020 (EP) ..................................... 20151440

(51) Int. Cl.
*G03F 7/20* (2006.01)
*G03F 7/00* (2006.01)

(52) U.S. Cl.
CPC ................................ *G03F 7/70483* (2013.01)

(58) Field of Classification Search
CPC ............. G03F 7/70483; G03F 7/70508; G03F 7/70525; G03F 7/70633
See application file for complete search history.

(56) References Cited

U.S. PATENT DOCUMENTS 6,952,253 B2   10/2005   Lof et al.
2006/0016561 A1   1/2006   Choi et al.
(Continued)

FOREIGN PATENT DOCUMENTS

CN   102200692   9/2011
EP   3309617   4/2018
(Continued)

OTHER PUBLICATIONS

Taiwanese Office Action issued in corresponding Taiwanese Patent Application No. 109127464, dated Jun. 14, 2022.
(Continued)

*Primary Examiner* — Mesfin T Asfaw
(74) *Attorney, Agent, or Firm* — Pillsbury Winthrop Shaw Pittman, LLP (57) ABSTRACT

A method of determining a control setting for a lithographic apparatus. The method includes obtaining a first correction for a current layer on a current substrate based on first metrology data associated with one or more previous substrates, and obtaining a second correction for the current layer on the current substrate. The second correction is based on a residual determined based on second metrology data associated with a previous layer on the current substrate. The method further includes determining the control setting for the lithographic apparatus for patterning the current layer on the current substrate by combining the first correction and the second correction.

20 Claims, 5 Drawing Sheets

(56) References Cited

U.S. PATENT DOCUMENTS

| | | |
|---|---|---|
| 2007/0085991 A1 | 4/2007 | Liegl et al. |
| 2010/0214550 A1 | 8/2010 | Hulsebos et al. |
| 2012/0008127 A1 | 1/2012 | Tel et al. |
| 2016/0062252 A1 | 3/2016 | Veeraraghavan et al. |
| 2018/0253017 A1* | 9/2018 | Adel .................... G03F 7/7085 |
| 2018/0307216 A1 | 10/2018 | Ypma et al. |
| 2019/0086810 A1 | 3/2019 | Tel et al. |

FOREIGN PATENT DOCUMENTS

| | | |
|---|---|---|
| EP | 3312672 | 4/2018 |
| EP | 3312693 | 4/2018 |
| EP | 3396458 | 10/2018 |
| TW | 200521631 | 7/2005 |
| TW | 201841071 | 11/2018 |
| WO | 2011081645 | 7/2011 |
| WO | 2013092106 | 6/2013 |
| WO | 2015101458 | 7/2015 |
| WO | 2015110191 | 7/2015 |
| WO | 2017140532 | 8/2017 |

OTHER PUBLICATIONS

International Search Report and Written Opinion issued in corresponding PCT Patent Application No. PCT/EP2020/070701, dated Oct. 27, 2020.

Taiwanese Office Action issued in corresponding Taiwanese Patent Application No. 109127464, dated Jul. 16, 2021.

Anonymous: "Intralot processing drift control", Research Disclosure, vol. 645, No. 45 (Dec. 12, 2017).

\* cited by examiner

METHOD FOR CONTROLLING A LITHOGRAPHIC APPARATUS

CROSS-REFERENCE TO RELATED APPLICATIONS

This application is the U.S. national phase entry of POT Patent Application No. PCT/EP2020/070701 which was filed on Jul. 22, 2020, which claims the benefit of priority of European Patent Application No. 19193151.8 which was filed on Aug. 22, 2019 and of European Patent Application No. 20151440.3 which was filed on Jan. 13, 2020 which are incorporated herein in their entireties by reference.

FIELD

The present invention relates to a method for controlling a lithographic apparatus used in patterning layers on substrates used in manufacturing of semiconductor devices. In particular, the invention relates to determining one or more control settings for the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD=k1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

It is often necessary to line up a comprehensive metrology measurement infrastructure to continuously measure characteristics of substrates subject to the process and features applied to said substrates. The metrology data is typically fed to process monitoring and process control equipment configured to stabilize the lithographic apparatus.

Substrates patterned using a lithographic process may be grouped into lots. A lot comprises a plurality of substrates exposed under similar lithographic conditions. Metrology performed on a previous lot of substrates may be used to determined corrections. These corrections may then be implemented on future exposures by the lithographic apparatus. Current methods of controlling and/or monitoring a semiconductor manufacturing process using the lithographic apparatus are based on a per lot correction of for example overlay, not taking substrate to substrate variability into account.

SUMMARY

It is an object of the present invention to improve control of overlay errors by taking substrate to substrate variation into account.

According to an aspect of the current disclosure there is provided a method of determining a control setting for a lithographic apparatus. The method comprises obtaining a first correction for a current layer on a current substrate based on first metrology data associated with one or more previous substrates; obtaining a second correction for the current layer on the current substrate based on a residual determined based on second metrology data associated with a previous layer on the current substrate; and determining the control setting for the lithographic apparatus for patterning the current layer on the current substrate by combining the first correction and the second correction.

Optionally, the first metrology data may comprise overlay data for a current layer on at least one previous substrate.

Optionally, the overlay data may comprise overlay measurements performed on a plurality of overlay marks.

Optionally, the residual may be a substrate specific component of the second metrology data.

Optionally, the second metrology data may comprise alignment data for the previous layer on the current substrate.

Optionally, the alignment data may comprise position measurements of a plurality of alignment marks on the previous layer on the current substrate.

Optionally the residual may comprise a residual alignment error of the previous layer on the current substrate.

Optionally, the residual may be determined based on a control characteristic of the lithographic apparatus.

Optionally, the control characteristic may be related to a capability of the lithographic apparatus in correcting position errors derived from corrections applied to control settings for a lithographic apparatus exposing the previous layer on the current substrate.

Optionally, determining the residual may comprise modifying the second metrology data based on an expected difference in sensitivities between the first metrology data and the second metrology data to one or more characteristics of the lithographic apparatus.

Optionally, the one or more characteristics of the lithographic apparatus may comprise one or more of: aberration levels, dynamic performance, dose, and focus; and wherein the sensitivities are derivable from simulating or measuring first metrology data and second metrology data for a plurality of values of the characteristics.

Optionally, the second metrology data may comprise overlay data of the previous layer on the current substrate.

Optionally, the residual may comprise a residual overlay error of the previous layer on the current substrate.

Optionally, determining the second correction may comprise determining an overlay error for the previous layer, determining the residual based on the first overlay error, and determining the second correction to be a fraction of the residual.

Optionally, the fraction of the residual may be substantially half of the residual.

Optionally, the method may further comprise determining one or more correctable components in the first overlay error for the previous layer on the current substrate, and determining the residual as the first overlay error minus the correctable components.

Optionally, the first correction may be configured to be applied to the current layer of a plurality of substrates.

Optionally, the first correction may comprise an Advanced Process Control (APC) correction.

Optionally, the second correction may be configured to be determined separately for each of a plurality of current substrates.

Optionally, the current substrate may comprise a plurality of exposure fields.

Optionally, determining a control setting may comprise determining a control setting for each of a plurality of exposure fields of the current substrate.

Optionally, the first correction may be an exposure field specific correction.

Optionally, the first correction may be a higher order process correction associated with the current substrate.

Optionally, the first correction may comprise a high-order intra-field process correction associated with one or more exposure fields on the current substrate.

Optionally, the second correction may be an exposure field specific correction, and wherein the residual is calculated on a per exposure field basis.

According to another aspect of the current disclosure there is provided an apparatus for determining a control setting of a lithographic apparatus, the apparatus comprising one or more processors configured to perform any of the methods as described above.

According to another aspect of the current disclosure there is provided a metrology apparatus comprising an apparatus as described above.

According to another aspect of the current disclosure there is provided an inspection apparatus comprising an apparatus as described above.

According to another aspect of the current disclosure there is provided a lithographic apparatus comprising an apparatus as described above.

According to another aspect of the current disclosure there is provided a lithographic cell comprising an apparatus as described above.

In another aspect of the invention a method of controlling a lithographic apparatus may be provided. The method may comprise obtaining a first correction for a current layer on a current substrate based on first metrology data associated with one or more previous substrates; obtaining a second correction for the current layer on the current substrate based on a residual calculated from second metrology data associated with a previous layer on the current substrate and a control characteristic of the lithographic apparatus; and determining a setting for controlling the lithographic apparatus during patterning of the current layer on the current substrate by combining the first and second correction.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
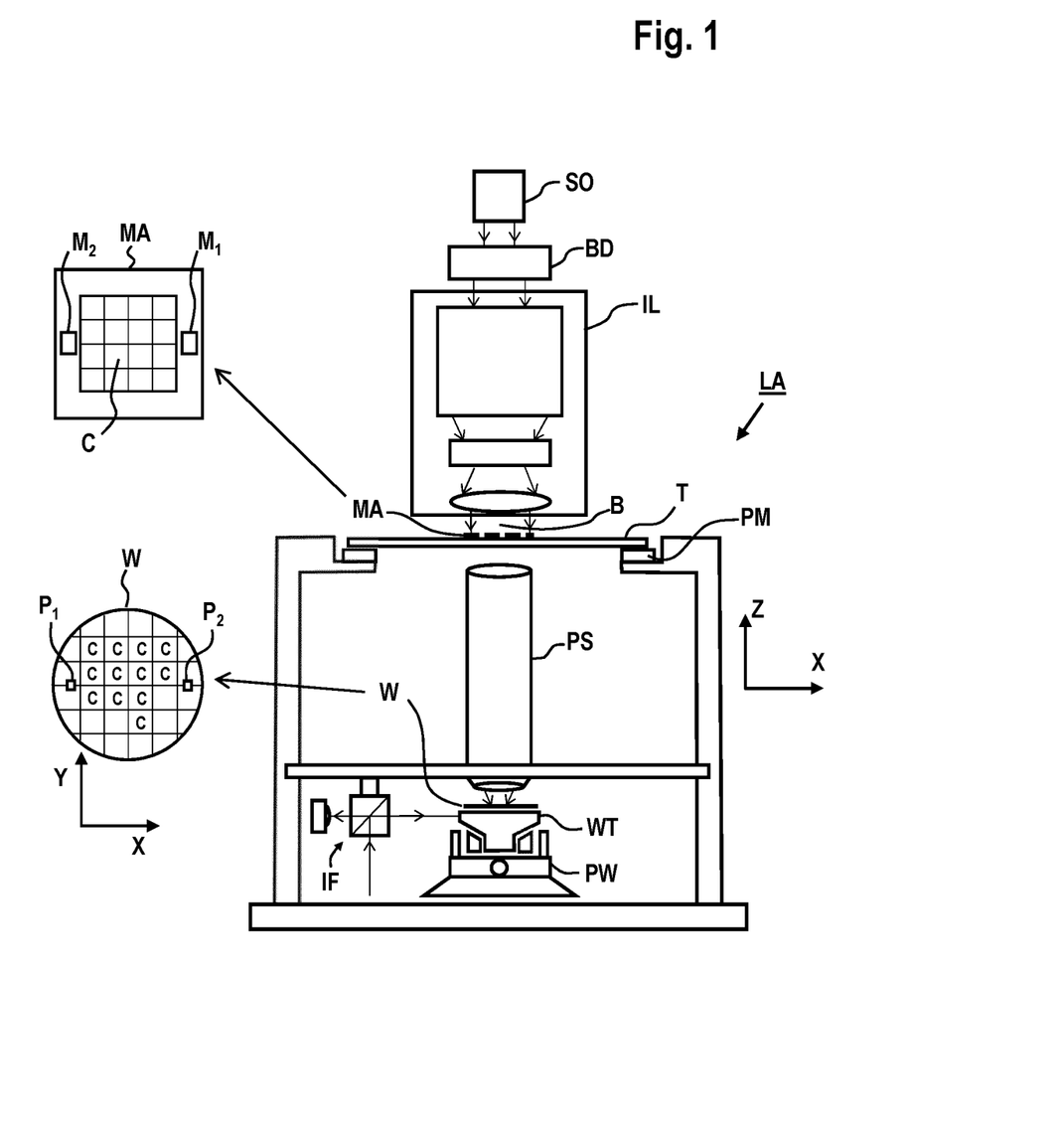
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
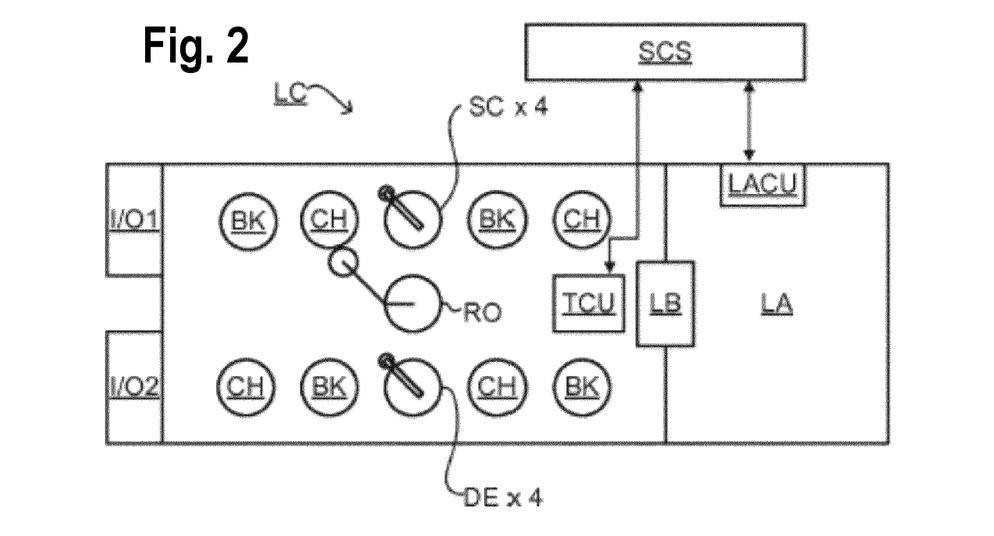
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
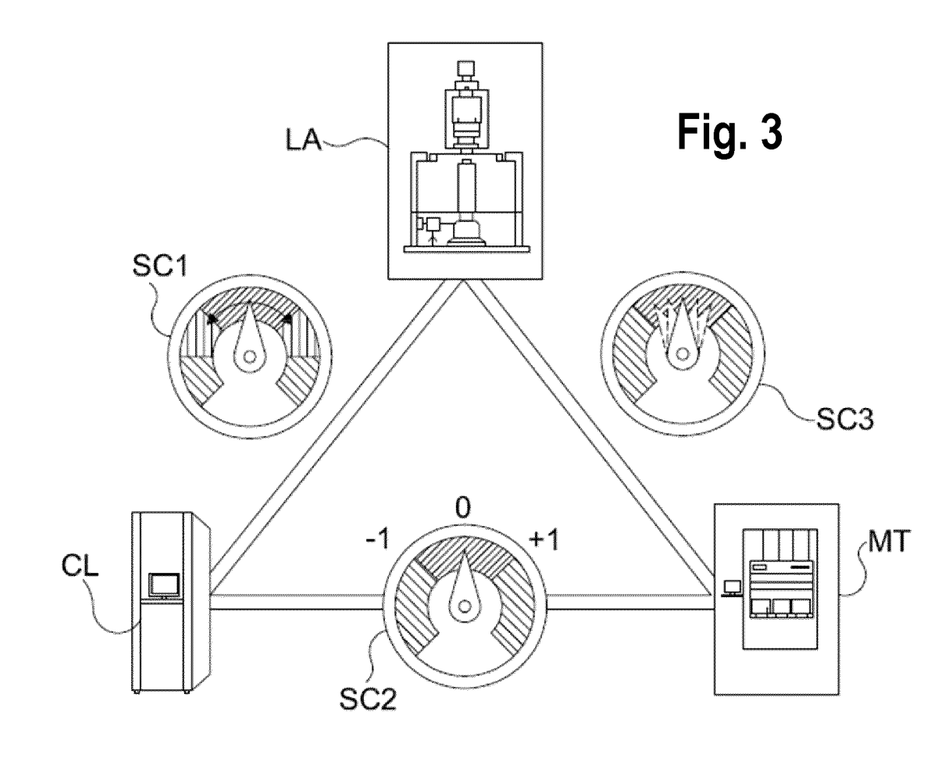
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each wafer accurately to a reference prior to patterning. This is done by measuring positions of alignment marks on the substrate using an alignment sensor. More information on the alignment procedure can be found in U.S. Patent Application Publication No. US20100214550, which is incorporated herein by reference. Pattern dimensioning (CD) errors may e.g. occur when the substrate is not positioned correctly with respect to a focal plane of the lithographic apparatus. These focal position errors may be associated with unflatness of a substrate surface. The lithographic apparatus minimizes these focal positon errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may e.g. be controlled using temperature control of the substrate or directing the plasma medium using a voltage controlled ring. More information on etching control can be found in international Patent Application Publication No. WO2011081645 and U.S. Patent Application Publication No. US20060016561 which are incorporated herein by reference.

During the manufacturing of the ICs it is of great importance that the process conditions for processing substrates using processing apparatus such as the lithographic apparatus or etching station remain stable such that properties of the features remain within certain control limits. Stability of the process is of particular importance for features of the functional parts of the IC, the product features. To guarantee stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as "Advanced Process Control" (further also referenced to as APC). More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. The metrology features reflect the response to process variations of the product features. The sensitivity of the metrology features to process variations may be different compared to the product features. In that case a so-called "Metrology To Device" offset (further also referenced to as MTD) may be determined. To mimic the behavior of product features the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The distribution of the locations across the substrate and/or patterning device where the metrology targets are present and/or measured is often referred to as the "sampling scheme". Typically the sampling scheme is selected based on an expected fingerprint of the relevant process parameter(s); areas on the substrate where a process parameter is expected to fluctuate are typically sampled more densely than areas where the process parameter is expected to be constant. Further there is a limit to the number of metrology measurements which may be performed based on the allowable impact of the metrology measurements on the throughput of the lithographic process. A carefully selected sampling scheme is important to accurately control the lithographic process without affecting throughput and/or assigning a too large area on the reticle or substrate to metrology features. Technology related to optimal positioning and/or measuring metrology targets is often referred to as "scheme optimization". More information on scheme optimization can be found in international Patent Application Publication No. WO 2015110191 and the European patent application, application number EP16193903.8 which are incorporated herein by reference.

Besides metrology measurement data also context data may be used for process control. Context data may comprise data relating to one or more of: the selected processing tools (out of the pool of processing apparatus), specific characteristics of the processing apparatus, the settings of the processing apparatus, the design of the circuit pattern and measurement data relating to processing conditions (for example wafer geometry). Examples of using context data for process control purposes may be found in the European patent application, application number EP16156361.4, and the international patent application, application number PCT/EP2016/072363 which are incorporated herein by reference. Context data may be used to control or predict processing in a feed-forward manner in case the context data relates to process steps performed before the currently controlled process step. Often context data is statistically correlated to product feature properties. This enables context driven control of processing apparatus in view of achieving optimal product feature properties. Context data and metrology data may also be combined e.g. to enrich sparse metrology data to an extent that more detailed (dense) data becomes available which is more useful for control and/or diagnostic purposes. More information on combining context data and metrology data can be found in U.S. Patent Provisional Application No. 62/382,764 which is incorporated herein by reference.

As said monitoring the process is based on acquisition of data related to the process. The required data sampling rate (per lot or per substrate) and sampling density depend on the required level of accuracy of pattern reproduction. For low-k1 lithographic processes even small substrate to substrate process variations may be significant. The context data and/or metrology data then need to enable process control on a per substrate basis. Additionally when a process variation gives rise to variations of a characteristic across the substrate the context and/or metrology data need to be sufficiently densely distributed across the substrate. However the time available for metrology (measurements) is limited in view of the required throughput of the process. This limitation imposes that the metrology tool may measure only on selected substrates and selected locations across the substrate. The strategies to determine what substrates need to be measured are further described in the European patent applications, application number EP16195047.2 and EP16195049.8 which are incorporated herein by reference.

In practice it is often necessary to derive from a sparse set of measurement values relating to a process parameter (across a substrate or plurality of substrates) a denser map of values associated with the substrate(s). Typically such a dense map of measurement values may be derived from the sparse measurement data in conjunction with a model associated with an expected fingerprint of the process parameter. More information on modeling measurement data can be found in international Patent Application Publication No. WO 2013092106 which is incorporated herein by reference.

More modern process control architectures may be based on at least two streams of metrology data inputs. A first stream of metrology data is typically based on frequently measured (2-4 substrates measured per lot, each lot typically containing 25 substrates) substrates and a further stream of metrology data based on less frequently measured data (not for every lot, but typically once every 10-30 lots). The first stream of metrology data normally comprises sparsely measured data, for example 200 data points of overlay error distributed evenly across a substrate. Typically the first stream of data may be associated with metrology measurements performed on metrology marks formed during at least an exposure and resist development step. Such data is referred to as After Development Inspection (ADI) data which is typically used as the workhorse for determining process correction on a lot to lot base; ADI metrology data may be modeled and used to derive corrections (control actions) for the upcoming lot of to be processed substrates. However the first stream of metrology data is normally not densely measured and hence less suitable to derive process corrections targeted to correct deviating process behavior across smaller regions on the substrates, such as individual (exposure) fields on the substrates.

In addition to the first stream of metrology data, often a further stream of metrology data may be provided to the process control and/or monitoring infrastructure. The further stream of metrology data typically may be measured for a few substrates only once every 5-30 lots, but comprises typically 400-2000 data points of overlay error distributed across the substrate. The further stream of metrology data is more suitable to derive control actions targeted to correct overlay errors at spatial scales which are not picked up by control actions derived from the first metrology data.). The first stream of metrology data may be referred to as sparse overlay metrology data, and the further stream of metrology data may be referred to as dense overlay metrology data.

The dense overlay metrology data may also be ADI data, but may also be After-Etch Inspection (AEI) metrology data. The dense overlay metrology data may be based on measurements performed on product features instead of metrology marks.

The control actions targeted to correct overlay errors across the entire substrate (based on the first and/or second metrology data) and the control actions targeted to correct overlay errors across a die, field or other region on the substrate (based on the second metrology data) are typically applied during APC corrections, wherein the sparse overlay metrology data may be modeled and used for the global substrate fingerprint correction and the dense overlay metrology data may be modeled as a field specific fingerprint correction (Correction Per Exposure CPE).

The model used to describe the sparse overlay metrology data (per substrate) is normally a global model configured to describe a global shape of an overlay error across a substrate. The model used to describe the dense overlay metrology data (per region on the substrate) is normally a higher order model configured to describe an intra-field (local) higher order fingerprint of an overlay error for one or more specific exposure fields.

Currently the overlay control actions are defined on a per lot basis, e.g. the APC control recipe may be applied equally to all substrates within a lot of substrates. The overlay correction may be based on overlay measurements associated with a previous lot of previous substrates. Typically the overlay measurements are performed on overlay marks comprising a first feature within a current layer on a substrate and a second feature within a previous layer on the substrate. Overlay errors resulting in relative position shifts between the first and second feature may be detected by a metrology apparatus across the surface of the substrate from which an overlay fingerprint can be derived per substrate. Different overlay fingerprints may be determined for different layers on a substrate. Typically the overlay data may be modeled first using a high order substrate and/or high order intra-field model, while higher order content which is not modellable (typically the residual) is used to define one or more CPE corrections. Typically the overlay measurements may be performed by a metrology tool, such as a scatterometer.

The overlay control actions, which may also be referred to as overlay corrections, may be determined based on historic data (e.g. overlay data associated with one or more previous lots). The control actions determined based on overlay data associated with one or more previous lots of substrates may be used to control the lithographic apparatus during patterning of a current layer on a current lot of current substrates. The overlay corrections may be fed forward to a future lot of substrates.

The overlay control actions as described in the paragraph above do not take substrate to substrate variations into account. The same control actions based on historic data associated with a previous lot of substrates may be applied to each of the substrates in a current lot, as the historic data is not able to take into account variations between substrates in the current lot. However, substrate to substrate variations of overlay error may occur between different substrates in a lot.

It is therefore proposed to determine a control setting for exposing a current layer on a current substrate using data related to the current substrate. In one example, the data may comprise alignment data for the current substrate. In-plane substrate deformations (due to processing for example) may be identified/picked up by substrate alignment measurements, which may indicate a significant variation between substrates in the current lot. If the control actions do not take into account data relating to the current substrate, these differences may be considered non-correctable content. In another example, the data may comprise overlay data for the current substrate. Overlay measurements of one or more previous layers of the current substrate may be used to infer a residual patterning error on a previous layer on the current substrate. The inferred patterning error may be fed forward to determine control setting for patterning the current layer on the current substrate.

Figure 6:
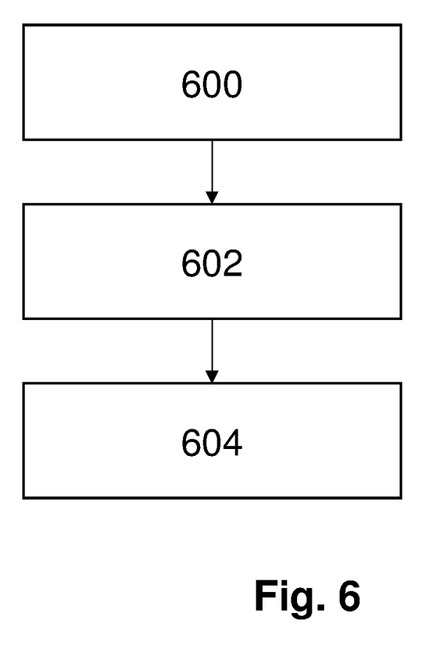
FIG. 6 depicts a flow diagram of steps in a method of determining a control setting for a lithographic apparatus.

Provided herein are methods for determining a control setting for a lithographic apparatus, as illustrated for example in the flow diagram of FIG. 6. The method may comprise determining 600 a first correction for a current layer on a current substrate. The first correction may be based on first metrology data associated with one or more previous substrates, for example a previous lot of substrates as described above. The method further comprises determining 602 a second correction for the current layer on the current substrate, wherein the second correction is based on a residual error of a previous layer on the current substrate. The residual may be determined based on second metrology data associated with the previous layer on the current substrate. The control setting for the lithographic apparatus for patterning the current layer on the current substrate may then be determined 604 by combining the first correction and the second correction.

The determination of a control setting based on the first correction based on historic data, and the second correction based on data of the current substrate mean that substrate-specific corrections may be applied. An advantage of this method may be that it allows the control settings to take into account residual errors which could not be corrected using the historic data associated with previous substrates. As a result, this method may enable substrate-specific corrections to be determined and applied as part of the control settings for a lithographic apparatus exposing the current layer on the current substrate.

As described above, the first correction may relate to a correction based on historic data, for example sparse and/or dense overlay metrology data from a previous lot of exposed substrates. The first correction may be non-substrate specific, and the same first correction may be applied to each substrate in a current lot of substrates. The first metrology data may comprise metrology data obtained from one or more overlay metrology marks present on the previous substrates.

The second correction may relate to a residual determined for the previous layer on the current substrate. The residual may be a non-modellable component of a patterning error of the previous layer on the current substrate. The residual may be an error that remains after processing corrections have been applied (e.g. alignment based stage and/or lens control corrections, APC control corrections based on previous lot overlay measurements, etc.) The residual may be specific to each substrate. The residual may be calculated based on knowledge related to at least one previous layer on the current substrate. The knowledge may comprise metrology data relating to one or more exposure characteristics (e.g. alignment, overlay) for the previous layer on the current substrate. The residual may be determined by combining knowledge of at least one of the previous layers on the current substrate with other information related to the current substrate. This information may for example comprise one or more control characteristics of the lithographic apparatus used for previous layers. The previous layer may be the lithographically exposed layer immediately below the current layer to be exposed on the current substrate. Control characteristics may comprise for example properties of control architecture, spatial resolution of actuators (e.g. control limits of spatial variations of alignment and/or overlay), temporal limitations of actuators (e.g. speed and/or hysteresis of actuators), configurations of the lithographic apparatus, such as software configuration (e.g. some software packages may not be able to implement all types of corrections, such as for example higher order corrections).

In a first implementation, alignment data of a previous layer on the current substrate may be used to determine a correction for the current layer on the current substrate, and an associated control setting for the lithographic apparatus configured to expose the current layer on the current substrate. The lithographic apparatus used to pattern the previous layer on the substrates comprised within the current lot typically provides so-called alignment residuals. These residuals represent a remaining position error (fingerprint) after corrections applied by the lithographic apparatus. It may happen that the substrate deformations have a geometry which is not fully correctable by the actuators (projection lens manipulators and reticle/wafer stage control actuating in space and time). As the residuals may vary between substrates it is not possible to optimally correct them during the providing of the current layer (by potentially a different lithographic apparatus) as the overlay correction does not distinguish between individual substrates within the current lot. The alignment residual measured for the previous layer on the current substrate may be considered a non-correctable error, or a residual alignment error, that is to say, a component of an alignment error which was not corrected for in the control setting for the lithographic apparatus exposing the previous layer on the current substrate.

It is hence proposed to provide a more advanced APC control architecture by feeding the residuals associated with alignment of the previous layer forward to the controller of the lithographic apparatus used in providing the current layer. The controller further receives process control input based on historic overlay measurements on a per lot basis and merges (combines) the per lot (overlay error) and per substrate (alignment residuals) corrections to derive a per substrate optimized correction for patterning the current layer on the current substrate.

Often the alignment measurements may be performed by the alignment measurement system of the lithographic apparatus patterning the previous layer of the current substrate. The alignment measurement system measures positional information of a plurality of alignment marks distributed across the substrate. Often the alignment marks may demonstrate a different sensitivity to characteristics of the lithographic apparatus, such as projection lens aberrations, stage dynamics parameters, dose errors, focus errors compared to the second features comprised within the overlay marks. Hence it may be preferred to modify the alignment measurement data based on a difference in sensitivity of the alignment marks compared to the second features of the overlay mark towards variations of said characteristics of the lithographic apparatus. The difference in sensitivity combined with information relating to the values of the characteristics (for example aberration levels of the lithographic apparatus) may be used to derive modified alignment residual data which better correlates to the overlay mark readings and hence is more compatible with the overlay control action (correction) data.

Figure 4:
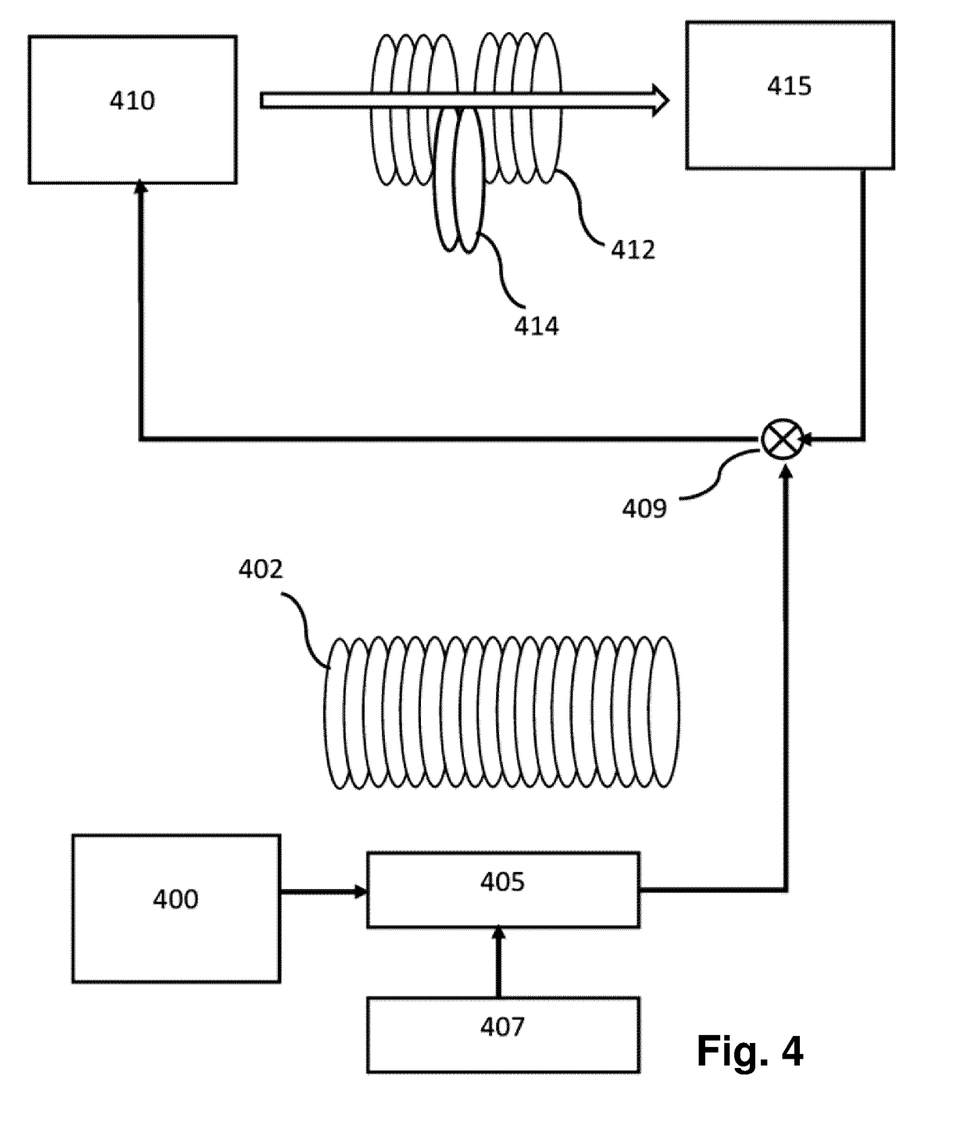
FIG. 4 depicts a control architecture according to an embodiment of the invention.

The improved control architecture is illustrated in FIG. 4. A lithographic apparatus 410 is scheduled to be used in patterning a current layer on a current lot of substrates 402. Substrates 414 of a previous lot (comprising also substrates 412) were subject to overlay measurement(s) by metrology tool 415. Process controller 409 receives overlay correction input from the metrology tool 415 and per substrate modified residual data 405 for providing optimized control of the lithographic apparatus during patterning of the current lot of substrates 402, which were subject to a patterning process 400 configured to provide a previous layer on the current lot of substrates 402. Modification of the residual data associated with the alignment marks may further be based on data and calculations 407 comprising combining differences in for example position sensitivities to projection lens aberrations of the alignment marks and the bottom gratings of overlay marks and actual aberration level of the projection lens of a lithographic apparatus used during patterning process 400 to obtain a better matched set of alignment residuals (better matched in a sense that the set is more compatible to overlay measurement data).

Figure 5A:
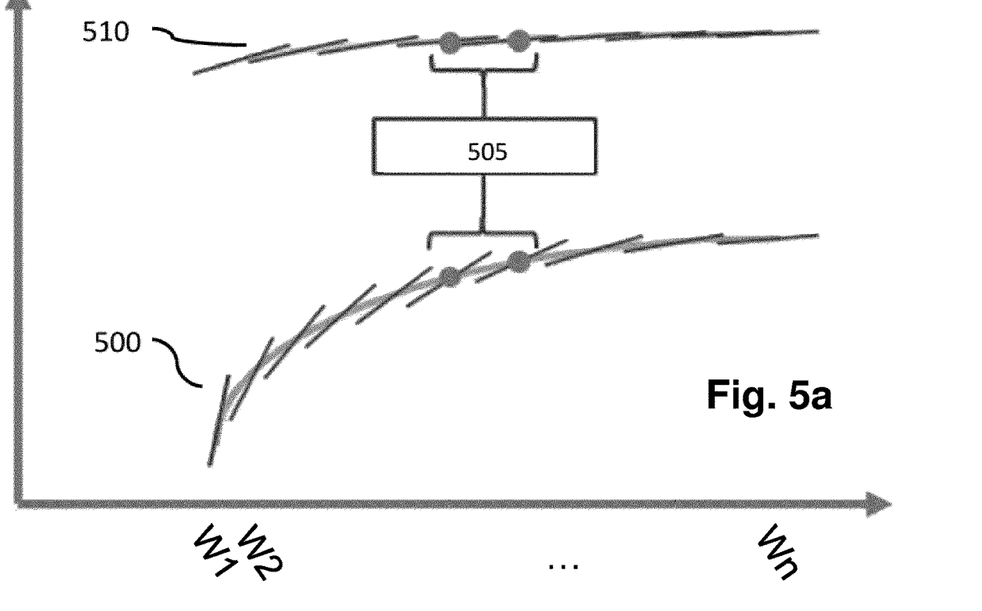
FIG. 5a depicts a substrate process flow according to the prior art.

FIG. 5a depicts a situation in line with a process control architecture according to the prior art, e.g. wherein process corrections are lot specific, but not substrate specific. Substrate-specific position correction of the current layer is only based on per substrate available alignment measurement data associated with said current layer. FIG. 5a depicts a first curve 500 describing a profile representing the positioning error residual of features across the previous layer for a plurality of substrates (wafers W1, W2, . . . Wn). The residual profile variation is depicted in a simplified manner by the direction of the wafer specific lines drawn on top of the curve 500. Curve 510 depicts a similar wafer to wafer residual profile variation, but now associated with the current layer. From the direction of the lines crossing the curves 500 and 510 it can be derived that it is expected that significant overlay error will occur; position residual profiles across the wafers are not matched between the current and previous layers. In the example of FIG. 5a, only for wafers 505 the overlay data will be measured by the metrology tool. As for these wafers the overlay error is not representative for the whole lot (the expected overlay errors due to residual alignment error is varying significantly between the different wafers (substrates) in the lot), the lot-based APC correction will not be optimal.

Figure 5B:
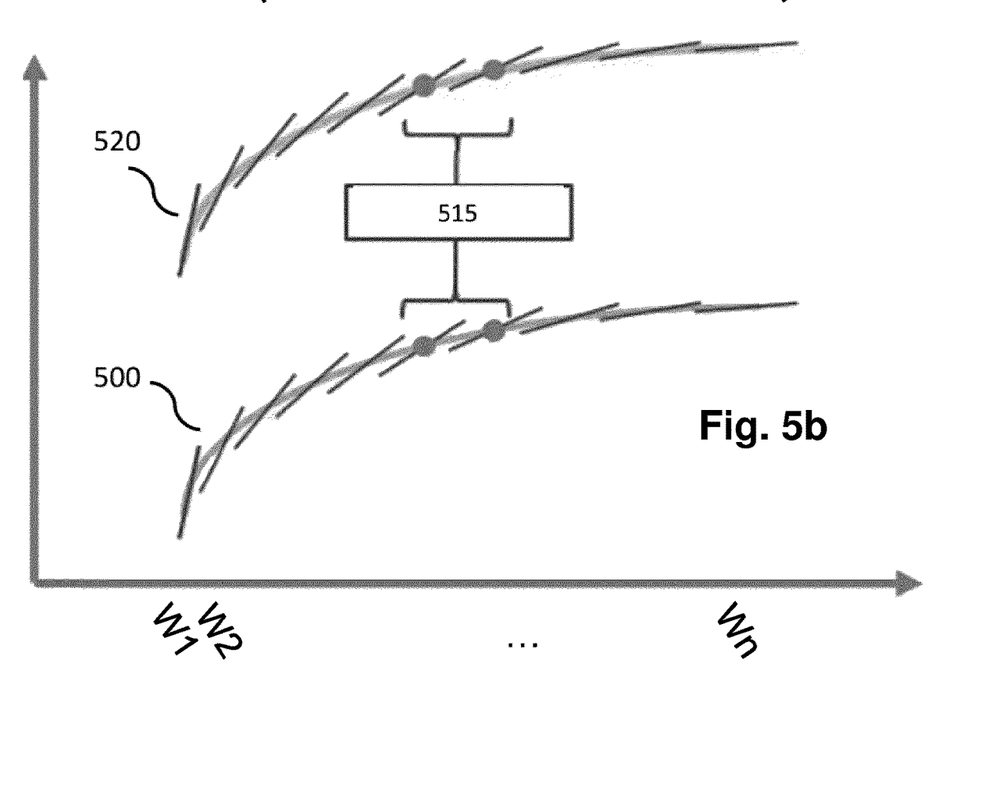
FIG. 5b depicts a substrate process flow according to an embodiment of the invention.

FIG. 5b depicts a situation according to an embodiment of the invention. Curve 500 and the lines crossing the curve are identical to the curve 500 as shown in FIG. 5a. Curve 520 demonstrates residual position error fingerprints associated with the current layer in case the residual position errors (alignment data) of the previous layer are fed forward. The control settings based on a combination of per lot corrections and per substrate (residual) corrections provides a much better matching between positioning error profiles of the current layer and the previous layer. Hence the expected overlay error will decrease significantly for the majority or all of the wafers (substrates) comprised within the current lot. As the overlay error is more similar for the different substrates in the lot, the overlay correction derived from overlay measurements on wafers 515 would then be less invasive (layers are already better matched due to the injection of per wafer alignment residual feed forward) and more representative for the current and future lots of substrates in case they are patterned using the control architecture of the invention.

In an embodiment of the invention a method of controlling a lithographic apparatus is provided, the method comprising: obtaining a first correction for a current layer on a current substrate based on first metrology data associated with one or more previous substrates; obtaining a second correction for the current layer on the current substrate based on a residual calculated from second metrology data associated with a previous layer on the current substrate and a control characteristic of the lithographic apparatus; and determining a setting for controlling the lithographic apparatus during patterning of the current layer on the current substrate by combining the first and second correction.

In an embodiment the first metrology data comprises values of overlay errors between the current and a previous layer.

In an embodiment the second metrology data comprises values of position measurements of alignment marks and the control characteristic relates to the capability of the lithographic apparatus in correcting position errors derived from the second metrology data. The position errors may be derived from the corrections (internal and/or external) from the lithographic apparatus during the exposure of the previous layer. The position errors may be residual errors remaining in the exposure after the corrections have been applied.

In an embodiment the first correction is configured to be applied to the current layer on all substrates in a lot of substrates associated with the current substrate.

In an embodiment the first correction is an Advanced Process Control (APC) correction.

In an embodiment the second correction is configured to be specifically applied to the current layer on the current substrate.

In an embodiment the current and one or more substrates comprise a plurality of exposure fields.

In an embodiment the setting for controlling the lithographic apparatus is specific for an exposure field out of the plurality of exposure fields on the current wafer.

In an embodiment the first correction is a higher order process correction associated with the current substrate.

In an embodiment the first correction is a higher order intra-field process correction associated with one or more exposure fields on the current substrate.

In an embodiment the first correction is configured as an exposure field specific correction.

In an embodiment the first metrology data is associated with overlay measurements performed on overlay marks comprising first features provided to the previous layer and second features provided to the current layer, and the second metrology data is associated with position measurements performed on third features provided to the previous layer.

In an embodiment the position measurements are obtainable from the lithographic apparatus and the overlay measurements are obtainable from a metrology tool.

In an embodiment the method further comprises modifying the second metrology data based on an expected difference in sensitivity of positions of the third features compared to positions of the first features to variations in one or more characteristics of the lithographic apparatus.

In an embodiment the modifying comprises calculating of a position offset of the third features with respect to the first features and adding the calculated position offset to the position measurements.

In an embodiment the characteristics are one or more of: aberration levels, dynamic performance, dose, focus and the sensitivities are derivable from simulating or measuring the position of the first and third features at a plurality of values of the characteristics.

In an embodiment the combining the first and second correction is on a per substrate basis.

In an embodiment the second correction is on a per exposure field basis, and the residual is calculated on a per exposure field basis.

In a second implementation of a method of determining a control setting of a lithographic apparatus as described herein, the second metrology data may comprise overlay data of at least one previous layer on the current substrate. Overlay errors between a previous layer and a current layer on a current substrate may be the result of individual patterning errors on each of those layers. The patterning errors may result from errors in any step of the pattering process for the previous layer, for example in the lithographic exposure, and/or in the etching process.

In an example implementation, a first layer is patterned with an overlay error P1, and a second layer, exposed on top of the first layer, is patterned with an overlay error P2. If no control or correction is applied, the overlay error between the first layer and second layer may be equal to P2–P1. In order to decrease this error, it may be beneficial to estimate the value of P2–P1 before exposing the second layer, so that a correction C can be applied to the second layer (P2+C), in order to reduce the size of the overlay error P2–P1+C. The overlay error remaining after the application of correction C, that is to say P2–P1+C, may be referred to as a residual overlay error between the first layer and the second layer.

In order to determine which value to set the correction C, the overlay error P2–P1 may be measured after the second layer has been exposed. Preferably, the overlay error is measured after all processing steps for the second layer have been completed (e.g. etching, development), so that the contributions to the overlay error for all processing steps can be included in the measurement and taken into account. This overlay value may be provided to a future exposure of a different substrate. However, this method of determining the value of correction C is based on historic data from previous substrates, and does not take into account substrate-specific overlay errors.

Substrate specific overlay errors may occur, for example due to drifting of apparatus and process properties over time, random, unpredictable errors occurring in the lithographic apparatus, patterning tools (e.g. deposition tool, etcher chamber, chuck, etc.). It may be possible to estimate or determine the properties for each individual tool and apparatus to take into account this variation. However, the overlay error may still comprise a random component, which may not be captured by models and/or measurements of other substrates. The random component of overlay error may for example comprise scanner reproducibility. Scanner reproducibility may comprise a metric indicating how well a lithographic apparatus LA is able to consistently deliver a requested parameter value (e.g. stage position in X, Y, and/or Z direction(s), focus, dose, aberration levels, etc.) The metric may for example comprise a (3)-sigma value over a plurality of obtained parameter values, and/or a Max-Mix value. However, it will be appreciated that other values may be determined as a metric of reproducibility.

As described above, alignment data relating to one or more previous layers on the current substrate may be used to apply substrate-specific corrections to control settings for a lithographic apparatus. However, alignment metrology data and overlay metrology data may have different sensitivities to characteristics of a lithographic apparatus. For example, the sensitivity of alignment measurements to aberrations may be different from the sensitivity of overlay measurements to those aberrations. Furthermore, alignment metrology data may be obtained based on alignment marks, which may have different dimensions to the patterned product features. The amount of alignment marks on a substrate may be limited, as space taken up by alignment marks is unavailable to product features.

It is therefore proposed herein to use overlay data relating to one or more previous layers on a current substrate, to calculate a correction for an exposure of a current layer on the current substrate. The correction may be intended to correct for a residual overlay error, for example to an unpredictable substrate-specific component of the overlay error. As described above, P1 may represent a patterning error of a first layer, and P2 may represent a patterning error of a second layer, wherein the first and second layers belong to the same substrate. The second layer may be the current layer that is to say, the next layer to be exposed by the lithographic apparatus, and for which the control setting is being determined. The first layer may be the previous layer, that is to say, the layer on the current substrate just below the current layer.

Overlay data may be used to infer a patterning error P1 for a previous layer on the current substrate. The previous layer may be the lithographically patterned layer immediately below the current layer to be exposed. The overlay data may be overlay metrology data, which may be measured from overlay marks present on the previous layer(s) on the substrate. The inferred patterning error may then be used to determine one or more control settings for a lithographic exposure of a current layer on the current substrate.

An overlay measurement of the previous layer may represent an overlay error P1–P0 resulting from the patterning error P1 of the previous layer and the patterning error P0 of the layer below the previous layer. As they were lithographically exposed as part of the same patterning process, the patterning errors P0 and P1 may be assumed to be of similar magnitude.

As disclosed herein, a weighted overlay error w*(P1–P0) of the previous layer on the current substrate may be applied as a correction C to the overlay of the current layer, that is to say, correction C=w*(P1–P0). The residual overlay error of the current layer then becomes $$P2-P1+C=P1+w(P1-P0)$$

The weight w may be a positive, real factor.

The factor applied by the weight w may be half (0.5), so that the residual overlay error of the current layer becomes $$P2 - P1 + C = P1 + \frac{1}{2}(P1 - P0) = P2 - \frac{(P1 + P0)}{2}$$

As P0 and P1 represent random errors, $$\frac{(P1 + P0)}{2}$$

only has half the variance (squared standard deviation) of P1. This means the residual overlay error may be significantly reduced compared to the residual overlay error without a correction (P2–P1). An advantage of applying half of the overlay error for the previous layer on the current substrate as a correction to the control setting for lithographically exposing the current layer is that substantially half the contribution of the patterning error of the previous layer may be removed from the residual overlay error on the current layer.

It is possible to apply a weight factor other than 0.5. For example, a weight factor of 0.25 may result a term $$\frac{(3P1 + P0)}{4}$$

which has a variance of 0.625, lower than the variance of 1 for the non-weighted case. In theory, a weight of 0.5 may provide the lowest variance, and therefore the greatest reduction in residual error. However, in practice, a weight value w deviating slightly from 0.5 (either higher or lower) may provide a better yield for a lithographic apparatus LA. The weight value w resulting in the best reduction in residual may be determined experimentally, for example based on a plurality of tests performed using different weight values.

Further embodiments are disclosed in the list of numbered clauses below:

1. A method of determining a control setting for a lithographic apparatus, the method comprising:
   obtaining a first correction for a current layer on a current substrate based on first metrology data associated with one or more previous substrates;
   obtaining a second correction for the current layer on the current substrate based on a residual determined based on second metrology data associated with a previous layer on the current substrate; and
   determining the control setting for the lithographic apparatus for patterning the current layer on the current substrate by combining the first correction and the second correction.
2. A method according to clause 1, wherein the first metrology data comprises overlay data for a current layer on at least one previous substrate.
3. A method according to clause 2, wherein the overlay data comprises overlay measurements performed on a plurality of overlay marks.
4. A method according to any of the preceding clauses, wherein the residual is a substrate specific component of the second metrology data.
5. A method according to any of the preceding clauses, wherein the second metrology data comprises alignment data for the previous layer on the current substrate.
6. A method according to clause 5, wherein the alignment data comprises position measurements of a plurality of alignment marks on the previous layer on the current substrate.
7. A method according to any of clauses 5-6, wherein the residual comprises a residual alignment error of the previous layer on the current substrate.
8. A method according to any of clauses 5-7, wherein the residual is determined based on a control characteristic of the lithographic apparatus.
9. A method according to clause 8, wherein the control characteristic is related to a capability of the lithographic apparatus in correcting position errors derived from corrections applied to control settings for a lithographic apparatus exposing the previous layer on the current substrate.
10. A method according to any of clauses 5-9, wherein determining the residual comprises modifying the second metrology data based on an expected difference in sensitivities between the first metrology data and the second metrology data to one or more characteristics of the lithographic apparatus.
11. A method according to clause 10, wherein the one or more characteristics of the lithographic apparatus comprise one or more of: aberration levels, dynamic performance, dose, and focus; and wherein the sensitivities are derivable from simulating or measuring first metrology data and second metrology data for a plurality of values of the characteristics.
12. A method according to any of the preceding clauses, wherein the second metrology data comprises overlay data of the previous layer on the current substrate.
13. A method according to any of the preceding clauses, wherein the residual comprises a residual overlay error of the previous layer on the current substrate.
14. A method according to any of clauses 12-13, wherein determining the second correction comprises determining an overlay error for the previous layer, determining the residual based on the first overlay error, and determining the second correction to be a fraction of the residual.
15. A method according to clause 14, wherein the fraction of the residual is substantially half of the residual.
16. A method according to any of clauses 14-15, further comprising determining one or more correctable components in the first overlay error for the previous layer on the current substrate, and determining the residual as the first overlay error minus the correctable components.
17. A method according to any of the preceding clauses, wherein the first correction is configured to be applied to the current layer of a plurality of substrates.
18. A method according to clause 17, wherein the first correction comprises an Advanced Process Control (APC) correction.
19. A method according to any of the preceding clauses, wherein the second correction is configured to be determined separately for each of a plurality of current substrates.
20. A method according to any of the preceding clauses, wherein the current substrate comprises a plurality of exposure fields.
21. A method according to clause 20, wherein determining a control setting comprises determining a control setting for each of a plurality of exposure fields of the current substrate.
22. A method according to any of clauses 20-21, wherein the first correction is an exposure field specific correction.
23. A method according to clause 21, wherein the first correction is a higher order process correction associated with the current substrate.
24. A method according to clause 23, wherein the first correction comprises a high-order intra-field process correction associated with one or more exposure fields on the current substrate.
25. A method according to any of clauses 20-24, wherein the second correction is an exposure field specific correction, and wherein the residual is calculated on a per exposure field basis.
26. An apparatus for determining a control setting of a lithographic apparatus, the apparatus comprising one or more processors configured to perform any of the methods of clauses 1-25.
27. A metrology apparatus comprising an apparatus according to clause 26.

28. An inspection apparatus comprising an apparatus according to clause 26.
29. A lithographic apparatus comprising an apparatus according to clause 26.
30. A lithographic cell comprising an apparatus according to clause 26.
31. A computer program product comprising computer readable instructions configured to perform, when executed on a suitable apparatus, the method of any of clauses 1 to 25.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of determining a control setting for a lithographic apparatus, the method comprising:
   obtaining a first correction for a current layer on a current substrate based on first metrology data associated with one or more previous substrates;
   obtaining a second correction for the current layer on the current substrate based on a residual determined based on second metrology data associated with a previous layer on the current substrate; and
   determining, by a hardware computer system, the control setting for the lithographic apparatus for patterning the current layer on the current substrate by combining the first correction and the second correction.

2. The method according to claim 1, wherein the first metrology data comprises overlay data for a current layer on at least one previous substrate and wherein the second metrology data comprises alignment data for the previous layer on the current substrate and wherein the residual comprises a residual alignment error of the previous layer on the current substrate.

3. The method according to claim 1, wherein the residual is a substrate specific component of the second metrology data.

4. The method according to claim 1, wherein the residual is determined based on a control characteristic of the lithographic apparatus.

5. The method according to claim 4, wherein the control characteristic is related to a capability of the lithographic apparatus in correcting position errors derived from corrections applied to control settings for a lithographic apparatus exposing the previous layer on the current substrate.

6. The method according to claim 1, further comprising determining the residual, wherein the determining the residual comprises modifying the second metrology data based on an expected difference in sensitivities between the first metrology data and the second metrology data to one or more characteristics of the lithographic apparatus.

7. The method according to claim 6, wherein the one or more characteristics of the lithographic apparatus comprise one or more selected from: an aberration level, dynamic performance, dose, and/or focus; and wherein the sensitivities are derivable from simulating or measuring first metrology data and second metrology data for a plurality of values of the one or more characteristics.

8. The method according to claim 1, wherein the residual comprises a first overlay error of the previous layer on the current substrate.

9. The method according to claim 8, further comprising determining the second correction, wherein the determining the second correction comprises determining an overlay error for the previous layer, determining the residual based on the first overlay error, and determining the second correction to be a fraction of the residual.

10. The method according to claim 9, wherein the fraction of the residual is substantially half of the residual.

11. The method according to claim 9, further comprising determining one or more correctable components in the first overlay error for the previous layer on the current substrate, and determining the residual as the first overlay error minus the one or more correctable components.

12. The method according to claim 1; wherein the first correction is configured to be applied to the current layer of a plurality of substrates.

13. The method according to claim 1, wherein the second correction is configured to be determined separately for each substrate out of a plurality of current substrates.

14. The method according to claim 13, wherein the second correction is an exposure field specific correction, and wherein the residual is calculated on a per exposure field basis.

15. The method according to claim 1, wherein the current substrate comprises a plurality of exposure fields and wherein the determining the control setting comprises determining a control setting for each of a plurality of exposure fields of the current substrate, wherein the first correction is an exposure field specific correction.

16. A computer program product comprising a non-transitory computer-readable medium having computer readable instructions therein, the instructions, when executed by a computer system, are configured to cause the computer system to at least:
   obtain a first correction for a current layer on a current substrate based on first metrology data associated with one or more previous substrates;
   obtain a second correction for the current layer on the current substrate based on a residual determined based on second metrology data associated with a previous layer on the current substrate; and determine a control setting for a lithographic apparatus for patterning the current layer on the current substrate by combining the first correction and the second correction.

17. The computer program product according to claim 16, wherein the instructions are further configured to cause the computer system to determine the residual and the instructions configured to cause the computer system to determine the residual are further configured to cause the computer system to modify the second metrology data based on an expected difference in sensitivities between the first metrology data and the second metrology data to one or more characteristics of the lithographic apparatus.

18. The computer program product according to claim 17, wherein the one or more characteristics of the lithographic apparatus comprise one or more selected from: an aberration level, dynamic performance, dose, and/or focus; and wherein the sensitivities are derivable from simulating or measuring first metrology data and second metrology data for a plurality of values of the one or more characteristics.

19. The computer program product according to claim 16, wherein the residual comprises a first overlay error of the previous layer on the current substrate.

20. The computer program product according to claim 19, wherein the instructions are further configured to cause the computer system to determine one or more correctable components in the first overlay error for the previous layer on the current substrate, and determine the residual as the first overlay error minus the one or more correctable components.

* * * * *